(12) United States Patent
Yu et al.

(10) Patent No.: US 8,362,545 B2
(45) Date of Patent: Jan. 29, 2013

(54) NONVOLATILE MEMORY DEVICE AND METHOD OF MANUFACTURING THE SAME

(75) Inventors: Tea-Kwang Yu, Hwaseong-si (KR); Jeong-Uk Han, Suwon-si (KR); Yong-Tae Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 17 days.

(21) Appl. No.: 13/064,344

(22) Filed: Mar. 21, 2011

(65) Prior Publication Data

US 2012/0068249 A1 Mar. 22, 2012

Related U.S. Application Data

(62) Division of application No. 12/289,297, filed on Oct. 24, 2008, now abandoned.

(30) Foreign Application Priority Data

Nov. 8, 2007 (KR) .......................... 10-2007-0113790

(51) Int. Cl.
*H01L 29/788* (2006.01)
(52) U.S. Cl. ................................ 257/321; 257/E29.304
(58) Field of Classification Search .................. 257/314, 257/315, 321, E29.3, E29.304
See application file for complete search history.

(56) References Cited

U.S. PATENT DOCUMENTS

| | | | |
|---|---|---|---|
| 5,643,814 A | 7/1997 | Chung | |
| 6,008,089 A | 12/1999 | Hong | |
| 6,159,801 A | 12/2000 | Hsieh et al. | |
| 6,329,245 B1 | 12/2001 | Da et al. | |
| 6,376,876 B1 | 4/2002 | Shin et al. | |
| 6,380,583 B1 | 4/2002 | Hsieh et al. | |
| 6,576,949 B1 | 6/2003 | Park | |
| 6,649,489 B1 | 11/2003 | Chang et al. | |
| 6,670,666 B2 | 12/2003 | Shimizu | |
| 6,696,724 B2 | 2/2004 | Verhaar | |
| 6,720,611 B2 | 4/2004 | Jang | |
| 6,743,675 B2 | 6/2004 | Ding | |
| 6,797,570 B2 | 9/2004 | Shin et al. | |
| 6,936,885 B2 | 8/2005 | Shin et al. | |
| 6,953,965 B2 | 10/2005 | Goda et al. | |
| 7,001,809 B2 | 2/2006 | Hsieh et al. | |
| 7,008,847 B2 | 3/2006 | Park | |
| 7,084,477 B2 | 8/2006 | Ishitsuka et al. | |
| 7,157,797 B2 | 1/2007 | Kojima | |
| 7,224,019 B2 | 5/2007 | Hieda et al. | |
| 7,224,020 B2 | 5/2007 | Wang et al. | |
| 7,230,343 B2 | 6/2007 | Wang et al. | |
| 7,253,493 B2 | 8/2007 | Wang et al. | |
| 7,417,278 B2 | 8/2008 | Hsieh et al. | |
| 7,514,742 B2 | 4/2009 | Yeh et al. | |
| 7,572,705 B1 | 8/2009 | Besser et al. | |
| 7,601,588 B2 | 10/2009 | Choi et al. | |

(Continued)

FOREIGN PATENT DOCUMENTS

| | | |
|---|---|---|
| JP | 2004-520716 | 7/2004 |
| KR | 10-1999-0061345 | 7/1999 |

(Continued)

*Primary Examiner* — Mary Wilczewski
(74) *Attorney, Agent, or Firm* — Harness, Dickey & Pierce, P.L.C.

(57) ABSTRACT

The nonvolatile memory device includes a semiconductor substrate, and a device isolation layer defining an active region in the semiconductor substrate. The device isolation layer includes a top surface lower than a top surface of the semiconductor substrate, such that a side-upper surface of the active region is exposed. A sense line crosses both the active region and the device isolation layer, and a word line, spaced apart from the sense line, crosses both the active region and the device isolation layer.

9 Claims, 10 Drawing Sheets

U.S. PATENT DOCUMENTS

| | | |
|---|---|---|
| 7,643,345 B2 | 1/2010 | Ishibashi |
| 7,649,779 B2 | 1/2010 | Ruttkowski et al. |
| 7,667,234 B2 | 2/2010 | Wang et al. |
| 7,674,685 B2 | 3/2010 | Choi et al. |
| 7,714,379 B2 | 5/2010 | Lee |
| 2003/0111684 A1 | 6/2003 | Park |
| 2004/0033664 A1 | 2/2004 | Park |
| 2006/0094203 A1 | 5/2006 | Choi et al. |
| 2006/0202263 A1 | 9/2006 | Lee |

FOREIGN PATENT DOCUMENTS

| | | |
|---|---|---|
| KR | 2003-0011094 | 2/2003 |
| KR | 10-2004-0005331 | 1/2004 |

Fig. 1

(CONVENTIONAL ART)

Fig. 2

(CONVENTIONAL ART)

Fig. 3

(CONVENTIONAL ART)

NONVOLATILE MEMORY DEVICE AND METHOD OF MANUFACTURING THE SAME

CROSS-REFERENCE TO RELATED APPLICATIONS

This application is a divisional of U.S. application Ser. No. 12/289,297 filed Oct. 24, 2008, now abandoned which claims priority under 35 U.S.C. §119 to Korean Patent Application No. 10-2007-0113790, filed on Nov. 8, 2007, the entire contents of which each are incorporated herein by reference.

BACKGROUND

1. Field

An example embodiments provides a semiconductor memory device and a method of manufacturing the same, and more particularly, to a nonvolatile memory device and a method of manufacturing the same.

2. Description of the Related Art

Nonvolatile memory devices can maintain stored data while external power is turned off. Such nonvolatile memory devices include a mask read only memory (mask ROM) device, an erasable programmable read-only memory (EPROM) device, an electrically erasable programmable read-only memory (EEPROM) device, and a flash memory device. The flash memory device is classified into a NOR-type flash memory device and a NAND-type flash memory device.

Figure 1:
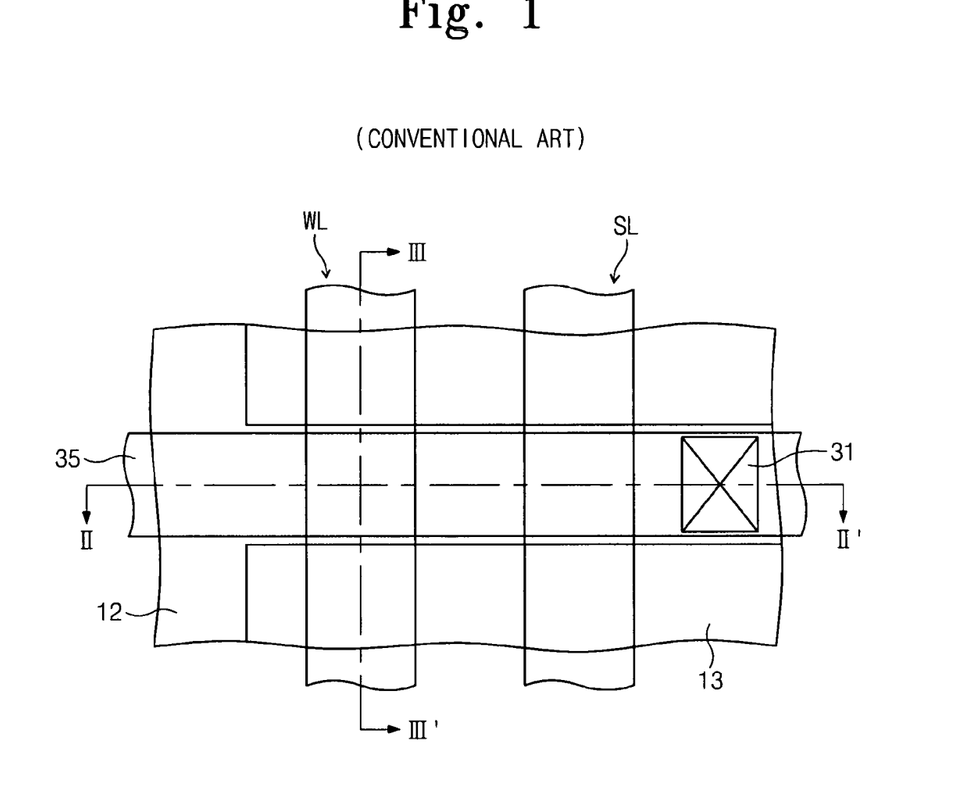
FIGS. 1 through 3 are views of a typical conventional memory device.
Figure 2:
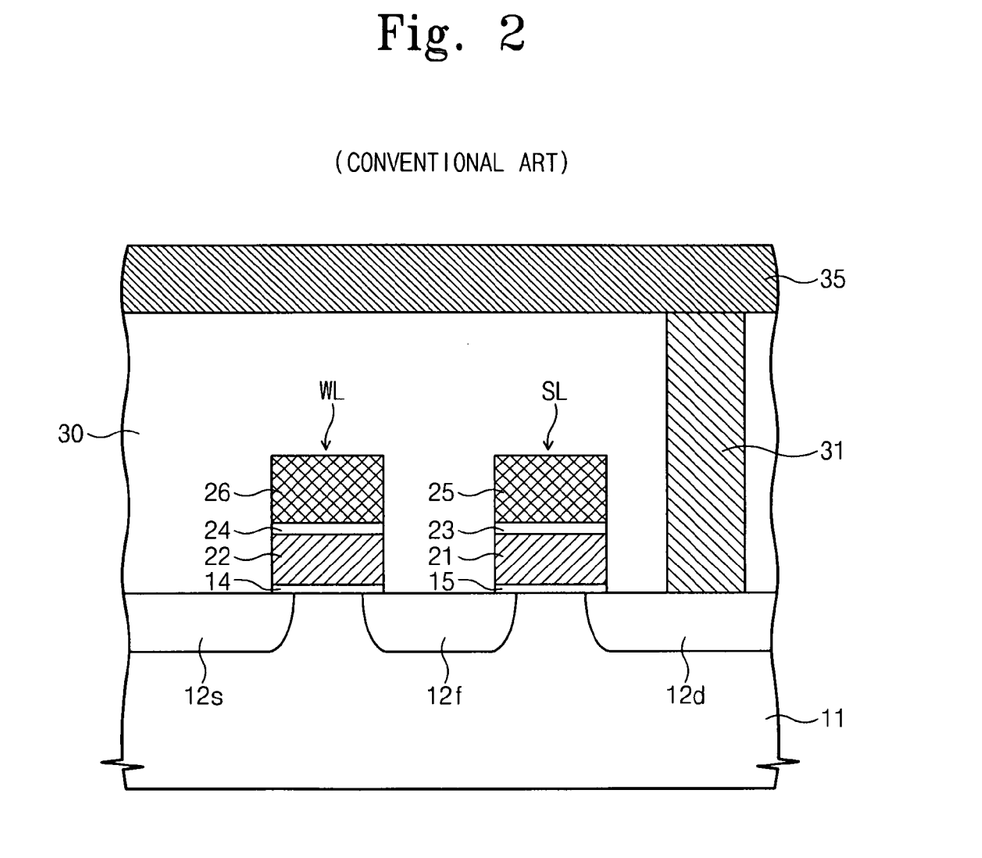
Figure 3:
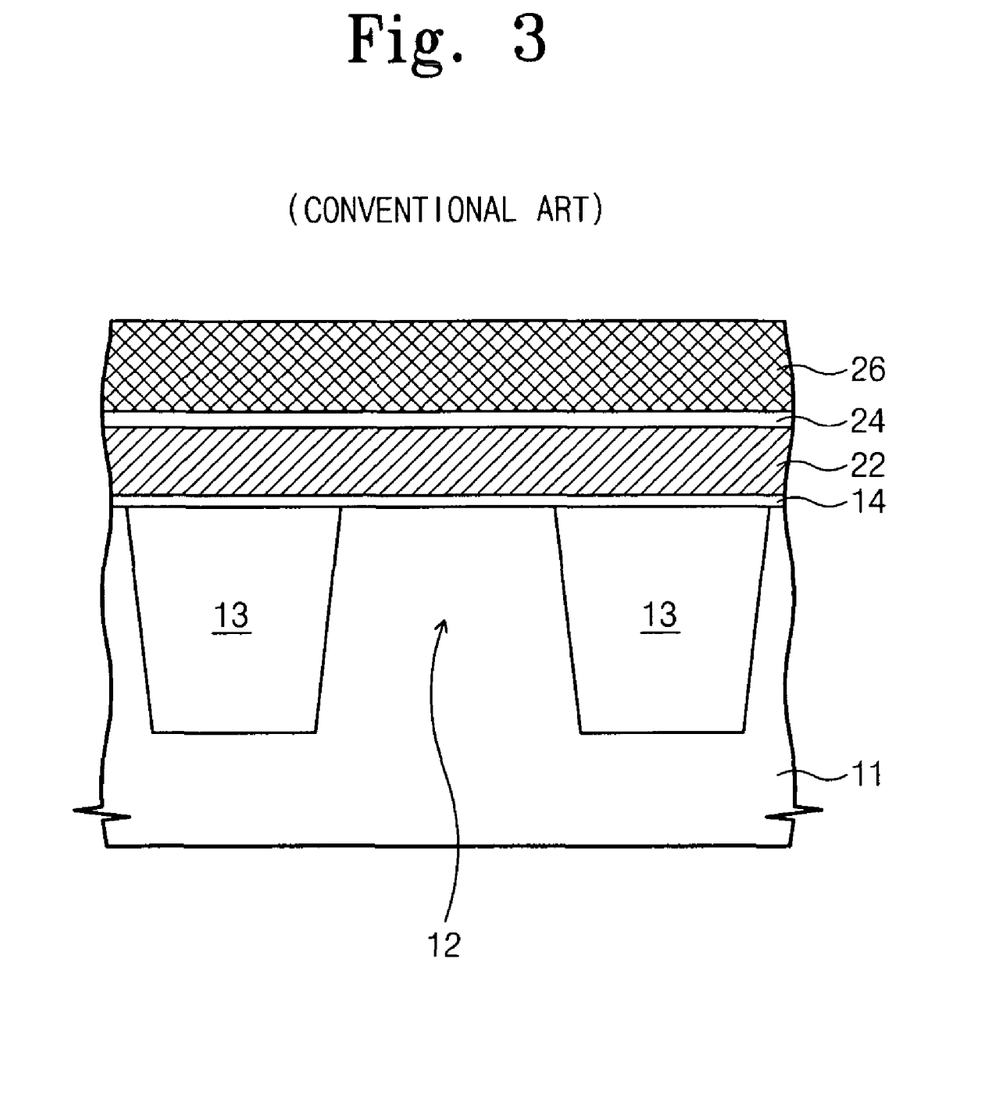

FIG. 1 is a plan view of a conventional EEPROM device. FIGS. 2 and 3 are cross-sectional views taken along lines II-II' and of FIG. 1, respectively. Referring to FIGS. 1 through 3, the EEPROM device includes an active region 12 defined by a device isolation layer 13 of a semiconductor substrate 11. The active region 12 includes a source region 12s, a drain region 12d, and a floating diffusion region 12f. A sense line structure SL crosses the active region 12. A word line structure WL. spaced apart from and parallel to the sense line structure SL crosses the active region 12.

An interlayer dielectric 30, covering the word line structure WL and the sense line structure SL, is disposed on the semiconductor substrate 11. A bit line contact plug 31 connected to the drain region 12d is disposed in the interlayer dielectric 30. A bit line 35 connected to the bit line contact plug 31 is disposed on the interlayer dielectric 30. The word line structure WL includes a gate insulation layer 14, a first gate electrode 22, an inter-gate dielectric 24, and a second gate electrode 26. The sense line structure SL includes a tunnel insulation layer 15, a floating gate electrode 21, an inter-gate dielectric 23, and a control gate electrode 25. The sense line structure SL is disposed on the active region 12 between the drain region 12d and the floating diffusion region 12f. The word line structure WL is disposed on the active region 12 between the source region 12s and the floating diffusion region 12f.

Since semiconductor devices are highly integrated, the channel width of a transistor including a word line structure WL may be reduced. As a result, a cell current may also be reduced, and a sense amplifier sensing an ON/OFF-state of a memory cell may be overloaded. Additionally, a low power voltage caused by the decreased cell current may reduce an operating speed of the semiconductor device.

SUMMARY

An example embodiment provides a nonvolatile memory device and a method of manufacturing the same that can increase a cell current.

In an example embodiment, a nonvolatile memory device includes a semiconductor substrate a device isolation layer defining an active region in the semiconductor substrate, the device isolation layer including a top surface lower than a top surface of the semiconductor substrate, such that a side-upper surface of the active region is exposed, a sense line crossing both the active region and the device isolation layer, and a word line spaced apart from the sense line and crossing both the active region and the device isolation layer.

In an example embodiment, the word line includes a gate insulation layer on the semiconductor substrate, and a gate electrode on the gate insulation layer.

In an example embodiment, the gate electrode disposed in the active region includes a bottom surface higher than a bottom surface of the gate electrode disposed in the device isolation layer.

In an example embodiment, a bottom surface of the gate electrode disposed in the device isolation layer is lower than a top surface of the active region.

In an example embodiment, a portion of the gate electrode faces the exposed side-upper surface of the active region.

In an example embodiment, the sense line includes a tunnel insulation layer on the semiconductor substrate, a floating gate on the tunnel insulation layer, an inter-gate dielectric on the floating gate, and a control gate on the inter-gate dielectric.

In an example embodiment, a bottom surface of the floating gate disposed in the active region is higher than a bottom surface of the floating gate disposed in the device isolation layer.

In an example embodiment, a portion of the floating gate faces the exposed side-upper surface of the active region.

In an example embodiment, a portion of the inter-gate dielectric and a portion of the control gate are lower than a top surface of the active region.

In an example embodiment, the active region includes a top surface, a side surface, and a rounded edge where the top surface and the side surface cross each other.

In an example embodiment, the sense line and the word line cross the rounded edge.

In an example embodiment, the nonvolatile memory device includes a pocket p-well on the semiconductor substrate, and an n-well surrounding the pocket p-well on the semiconductor substrate.

In an example embodiment, a nonvolatile memory device comprises an active region in a semiconductor substrate, the active region having a top surface higher than a top surface of at least one neighboring device isolation layer, and first and second transistor structures formed on the active region.

In an example embodiment, the top surface of the active region has a rounded edge.

In an example embodiment, the first transistor structure includes a portion of a word line and the second transistor structure includes a portion of a sense line.

In an example embodiment, a word line connects to the first transistor structure and a sense line connects to the second transistor structure.

In an example embodiment, the first transistor structure comprises a gate insulation layer, a first gate electrode, a first inter-gate dielectric, and a second gate electrode.

In an example embodiment, the second transistor structure comprises a tunnel insulation layer, a floating gate, a second inter-gate dielectric, and a control gate.

In an example embodiment, a card comprises a nonvolatile memory including a semiconductor substrate, at least one device isolation layer defining an active region in the semiconductor substrate, the device isolation layer including a top surface lower than a top surface of the semiconductor substrate, such that a side-upper surface of the active region is exposed, a sense line crossing both the active region and the device isolation layer, and a word line spaced apart from the sense line and crossing both the active region and the device isolation layer, and a control unit configured to control the memory.

In an example embodiment, the active region comprises a top surface, a side surface, and a rounded edge where the top surface and the side surface cross each other, and the sense line and the word line cross the rounded edge.

In an example embodiment, a method of manufacturing a nonvolatile memory device includes forming a device isolation layer defining an active region in a semiconductor substrate, the device isolation layer including a top surface lower than that of the semiconductor substrate, to expose a side-upper surface of the active region, forming a sense line crossing both the active region and the device isolation layer, and forming a word line spaced apart from the sense line and crossing both the active region and the device isolation layer.

In an example embodiment, forming the device isolation layer includes forming a trench in the semiconductor substrate, forming a preliminary device isolation layer filling the trench, and recessing a portion of the preliminary device isolation layer to expose the side-upper surface of the active region.

In an example embodiment, the portion of the preliminary device isolation layer is recessed using a wet etching process.

In an example embodiment, the preliminary device isolation layer includes a silicon oxide layer, and the wet etching process is performed with a solution including hydrofluoric acid.

In an example embodiment, a method of manufacturing a nonvolatile semiconductor device includes rounding an edge of the semiconductor substrate in the active region.

In an example embodiment, rounding the edge of the semiconductor substrate includes etching the edge with a mixture solution of $NH_4OH$, $H_2O_2$ and $H_2O$.

In an example embodiment, rounding the edge of the semiconductor substrate includes oxidizing the edge of the semiconductor substrate, and etching the oxidized edge.

In an example embodiment, forming the word line includes forming a gate insulation layer on the semiconductor substrate, and forming a gate electrode on the gate insulation layer, wherein a bottom surface of the gate electrode disposed in the active region is higher than a bottom surface of the gate electrode disposed in the device isolation layer.

BRIEF DESCRIPTION OF THE DRAWINGS

The above and other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
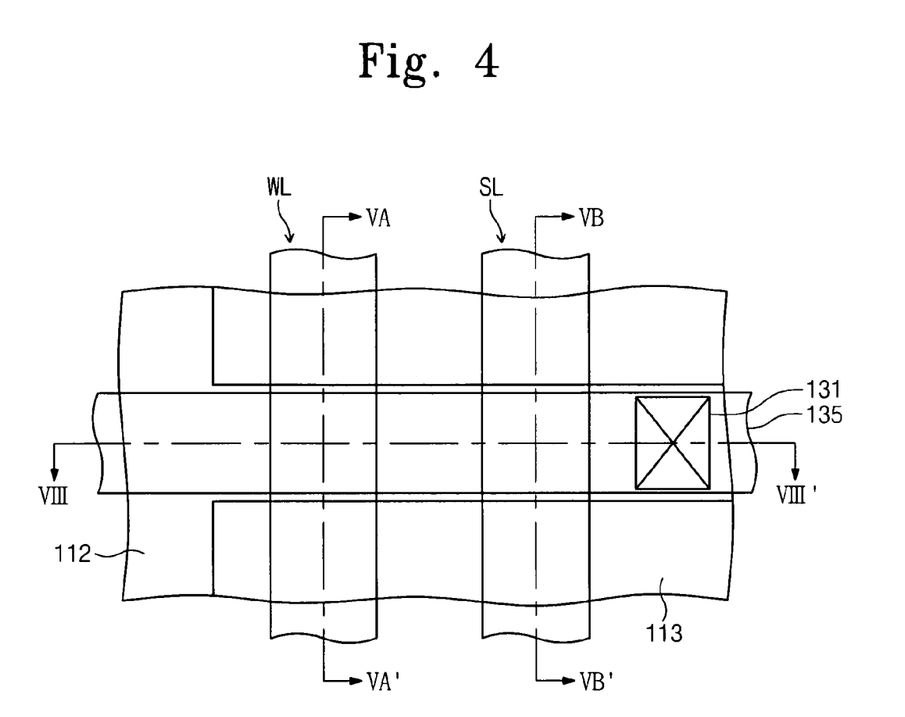
FIGS. 4 through 8 are views illustrating a method of forming a nonvolatile memory device according to an example embodiment.
Figure 5A:
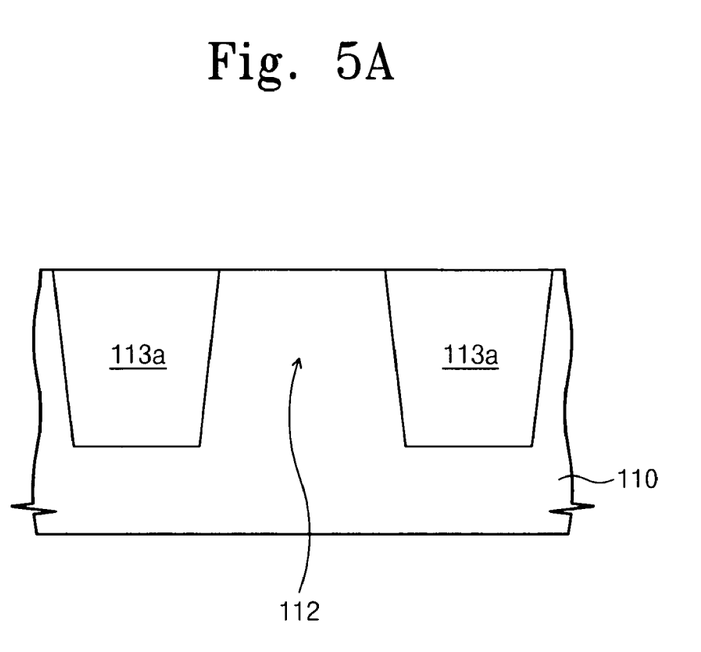
Figure 5B:
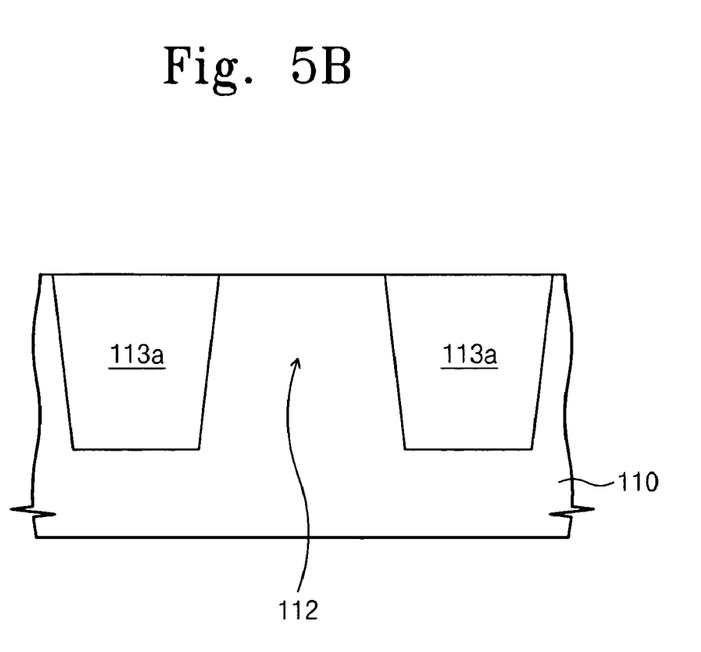
Figure 6A:
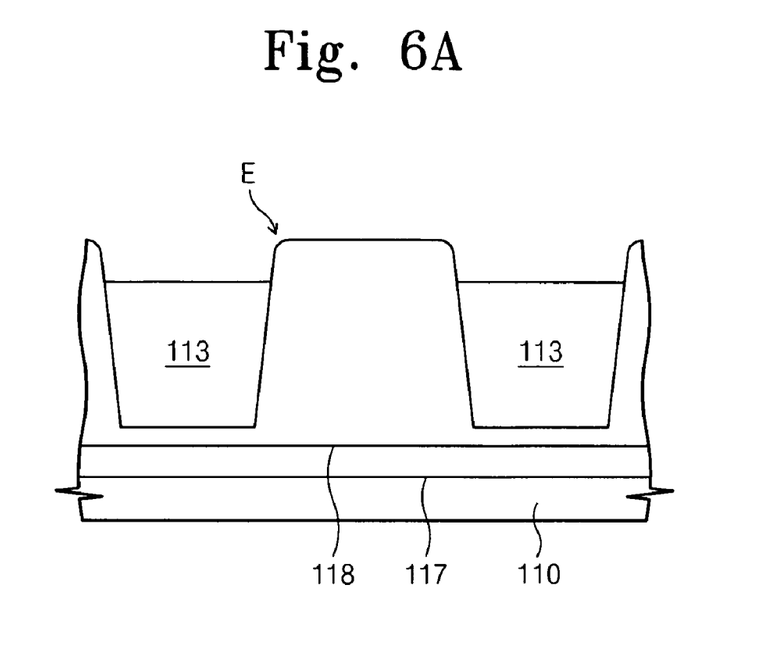
Figure 6B:
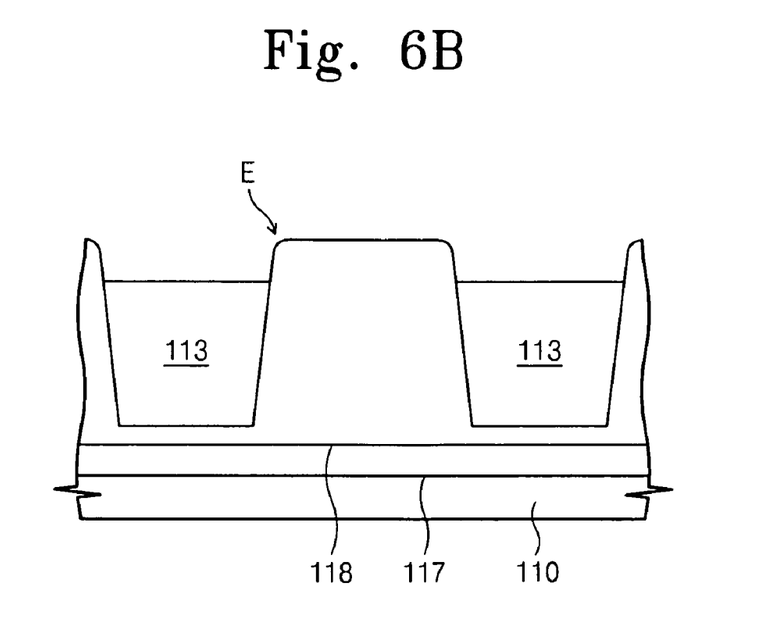
Figure 7A:
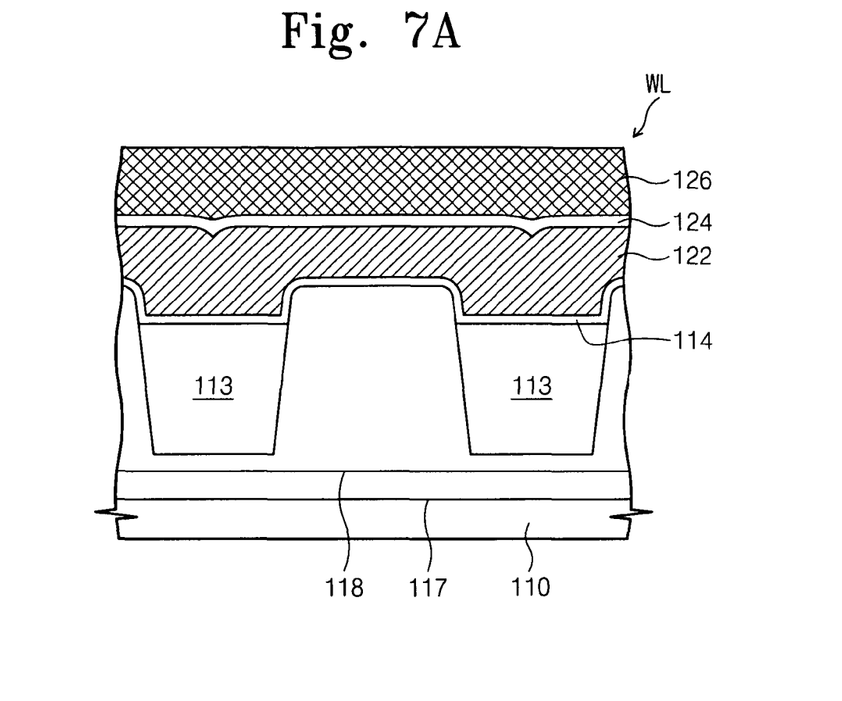
Figure 7B:
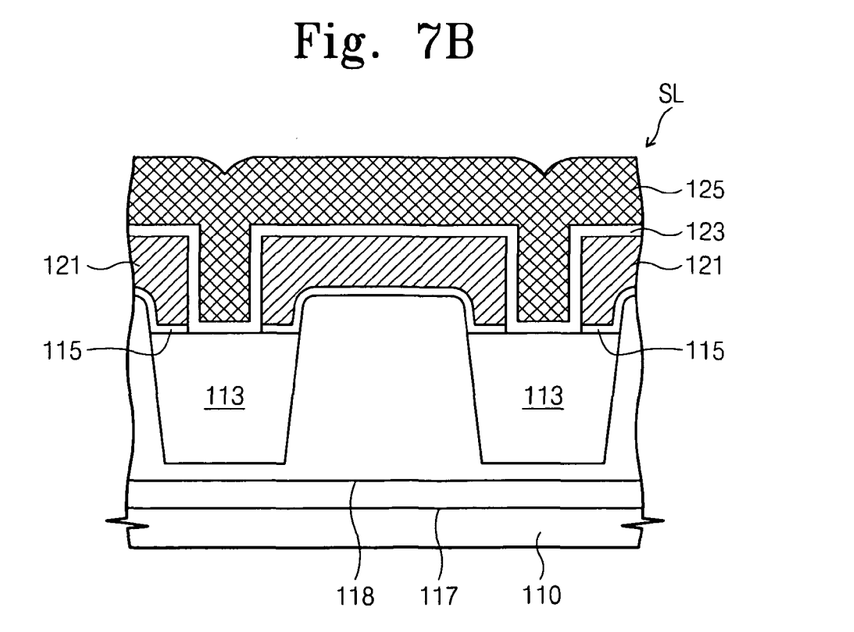
Figure 8:
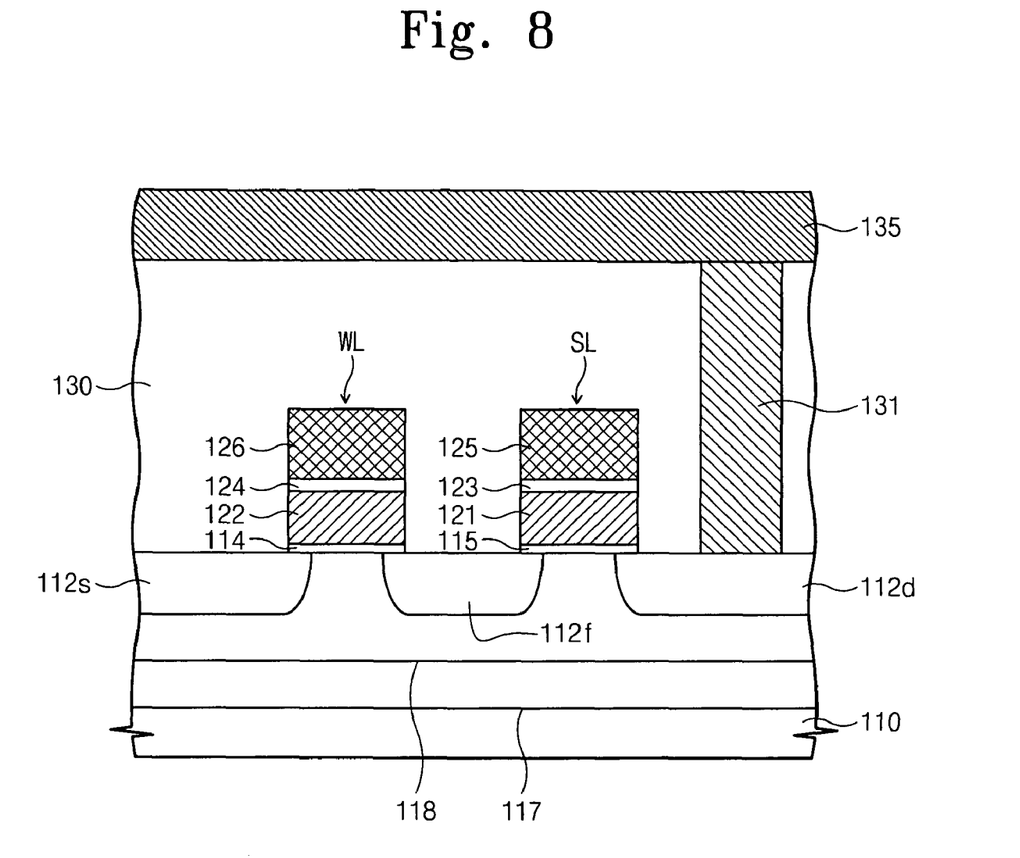

FIG. 4 is a plan view illustrating a method of forming a nonvolatile memory device according to an example embodiment. FIGS. 5A, 6A and 7A are cross-sectional views taken along a line VA-VA' of FIG. 4. FIGS. 5B, 6B and 7B are cross-sectional views taken along a line VB-VB' of FIG. 4. FIG. 8 is a cross-sectional views taken along a line VIII-VIII' of FIG. 4.

Referring to FIGS. 5A and 5B, a semiconductor substrate 110 is prepared. A preliminary device isolation layer 113a defining an active region 112 is formed in the semiconductor substrate 110. The forming of the preliminary device isolation layer 113a may include forming a trench in the semiconductor substrate 110 and forming a dielectric filling the trench. For example, the preliminary device isolation layer 113a may be formed through a shallow trench isolation (STI) method, and the preliminary device isolation layer 113a may be formed of a silicon oxide.

Referring to FIGS. 6A and 6B, a portion of the preliminary device isolation layer 113a is recessed to form a device isolation layer 113. The device isolation layer 113 is formed to expose side-upper surfaces of the active region 112. Accordingly, the active region 112 in the semiconductor substrate 110 protrudes above the device isolation layer 113. The recessed portion of the preliminary device isolation layer 113a may be removed through a wet etching process. The wet etching process may be performed with a solution including hydrofluoric acid. The protruding semiconductor substrate 110 may have a rounded edge E. Since the semiconductor substrate 110 has a rounded edge E, an electric field that may concentrate on an angled edge can be reduced or prevented, thereby decreasing deterioration of a gate insulation layer and a tunnel insulation layer.

The rounding of the edge of the semiconductor substrate 110 may include etching an angled edge with a mixture solution of $NH_4OH$, $H_2O_2$ and $H_2O$. Since the angled edge is etched more intensively than a flat portion of the semiconductor substrate 110, the rounded edge E can be formed. The rounding of the edge E may include oxidizing the angled edge of the semiconductor substrate 110, and etching the oxidized edge. A pocket p-well 118 and an n-well 117 surrounding the pocket p-well 118 may be formed on the semiconductor substrate 110.

Referring to FIGS. 7A and 7B, a sense line structure SL and a word line structure WL are formed, crossing the active region 112 and the device isolation layer 113. The sense line structure SL and the word line structure WL may be simultaneously patterned. As shown in FIG. 7B, the sense line structure SL includes a tunnel insulation layer 115, a floating gate 121, a first inter-gate dielectric 123, and a control gate 125 that are sequentially stacked. As shown in FIG. 7A, the word line structure WL includes a gate insulation layer 114, a first gate electrode 122, a second inter-gate dielectric 124, and a second gate electrode 126 that are sequentially stacked. The first and the second gate electrode 122 and 126 may be connected through a butting contact. Alternatively, the first gate electrode 122 may be connected to a metal contact (not shown) for applying voltage.

A bottom surface of the first gate electrode 122 disposed in the active region 112 is higher than a bottom surface of the first gate electrode 122 in the device isolation layer 113. A portion of the first gate electrode 122 may face the exposed side-upper surfaces of the active region 112. That is, the active region 112 that the first gate electrode 122 crosses has a three-dimensional structure with a substantially improved effective channel width, to increase a cell current.

Referring to FIGS. 4 and 8, an ion-implantation process is performed to form a source region 112s, a drain region 112d, and a floating diffusion region 112f after the word line structure WL and the sense line structure SL are formed. An interlayer dielectric 130 is formed to cover the word line structure WL and the sense line structure SL. Then, a bit line contact plug 131 is formed to penetrate through the interlayer dielectric 130 and contact the drain region 112d. A bit line 135 contacting the bit line contact plug 131 is disposed on the interlayer dielectric 130.

Referring to FIGS. 7A and 7B, aspects of the nonvolatile memory device according to an example embodiment will be described.

The device isolation layer 113 is provided to define the active region 112 in the semiconductor substrate 110 and have a top surface lower than a top surface of the semiconductor substrate 110. The device isolation layer 113 exposes the side-upper surfaces of the active region 112. The device isolation layer 113 may include a silicon oxide layer. The sense line structure SL and the word line structure WL are provided, and cross the active region 112 and the device isolation layer 113.

The word line structure WL may include the gate insulation layer 114, the first gate electrode 122, the first inter-gate dielectric 124, and the second gate electrode 126 on the semiconductor substrate 110. A bottom surface of the first gate electrode 122 in the active region 112 is higher than a bottom surface of the first gate electrode 122 in the device isolation layer 113. A portion of the first gate electrode 122 may face the exposed side-upper surfaces of the active region 112. That is, the active region 112 that the word line structure WL crosses has a three-dimensional structure, and a substantially effective channel width is extended without increasing the size of a cell.

The sense line structure SL may include the tunnel insulation layer 115, the floating gate 121, the second inter-gate dielectric 123, and the control gate 125 on the semiconductor substrate 110. The gate insulation layer 114 and the tunnel insulation layer 115 may be formed of a silicon oxide. The first and the second gate electrodes 122 and 126, the floating gate 121, and the control gate 125 may include a poly-silicon. The first and the second inter-gate dielectrics 124 and 123 may be formed of an oxide-nitride-oxide (ONO).

The sense line structure SL and the word line structure WL may cross the rounded edge of the semiconductor substrate 110 in the active region 112. The rounded edge may reduce or prevent the concentration of the electric field and accordingly may reduce or prevent the deterioration of the gate insulation layer 114 and the tunnel insulation layer 115.

According to an example embodiment, a top surface of the device isolation layer is lower than a top surface of the semiconductor substrate. Therefore, a channel region of the word line has a three-dimensional structure, and the width of the channel increases to cause the increase of the cell current.

Figure 9:
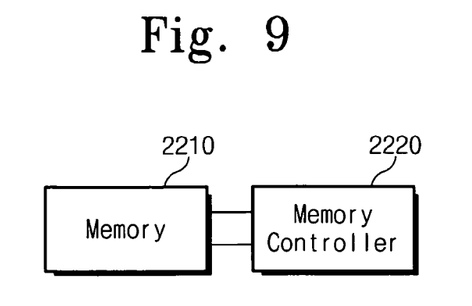
FIGS. 9 through 13 are views illustrating the implementation of a nonvolatile memory device according to an example embodiment in various applications of semiconductor devices.

FIG. 9 illustrates an example embodiment of an application of the semiconductor device. As shown, this embodiment includes a memory 2210 connected to a memory controller 2220. The memory 2210 may be any of the semiconductor device embodiments described above. The memory controller 2220 supplies the input signals for controlling operation of the memory 2210. For example, the memory controller 2220 supplies a command CMD and address signals.

Figure 10:
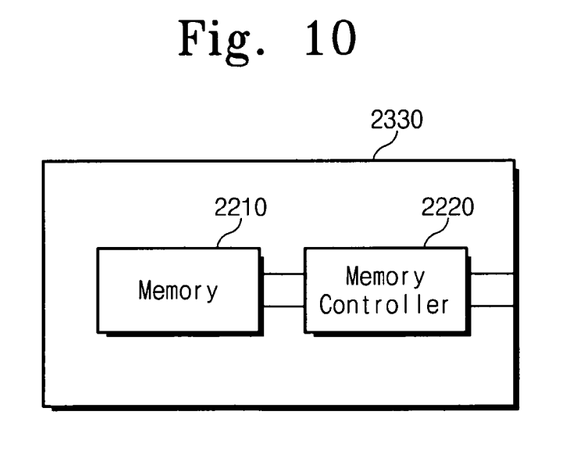

FIG. 10 illustrates yet another example embodiment. This embodiment is the same as the embodiment of FIG. 9, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 11:
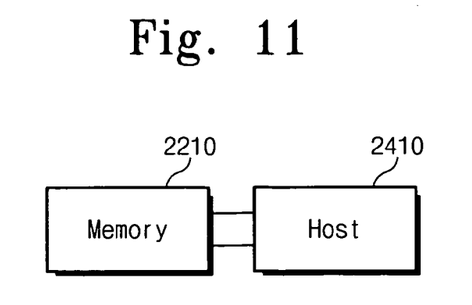

FIG. 11 illustrates a still further example embodiment. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 12:
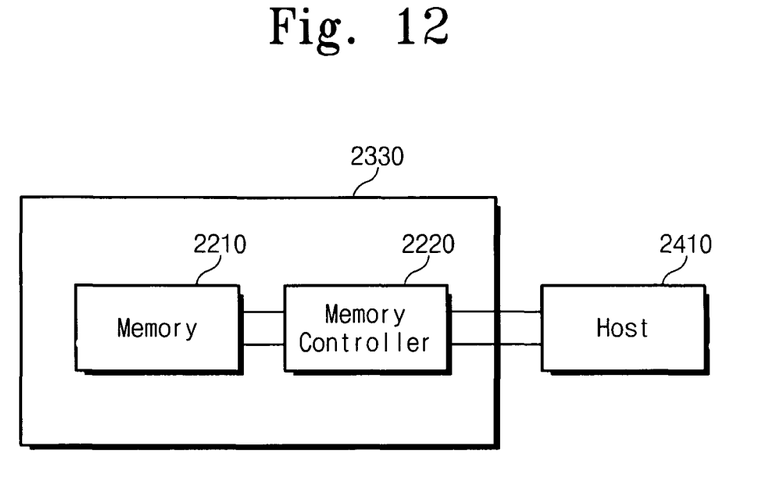

FIG. 12 illustrates an example embodiment in which the host system 2410 is connected to the card 2330 of FIG. 10. In this embodiment, the host system 2410 applies control signals to the card 2330 such that the memory controller 2220 controls operation of the memory 2210.

Figure 13:
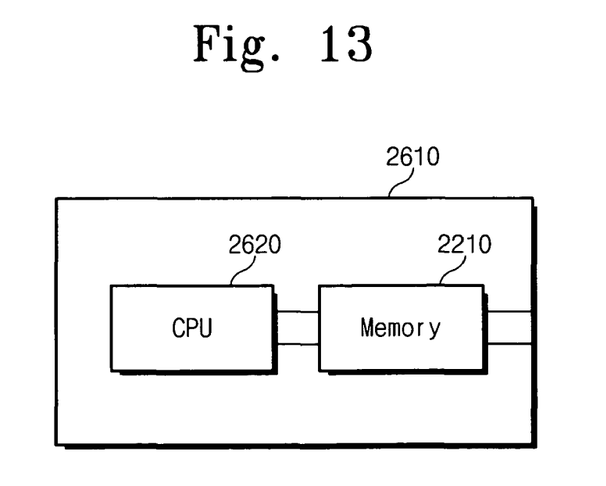

FIG. 13 illustrates a further example embodiment. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 13 does not illustrate the full complement of components that may be included within a computer system 2610 for the sake of clarity.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A nonvolatile memory device comprising:
    an active region in a semiconductor substrate, the active region having a top surface higher than a top surface of at least one neighboring device isolation layer; and
    first and second transistor structures formed on the active region, gate structures of the first and second transistor structures being formed on a pocket p-well, wherein
        the first transistor structure includes a gate insulation layer, a first gate electrode, a first inter-gate dielectric and a second gate electrode sequentially stacked, and the first and second gate electrodes are connected, and
        the second transistor structure includes a tunnel insulation layer, a floating gate, a second inter-gate dielectric, and a control gate sequentially stacked.

2. The nonvolatile memory device of claim 1, wherein the top surface of the active region has a rounded edge.

3. The nonvolatile memory device of claim 2, wherein
    the first transistor structure includes a portion of a word line, and
    the second transistor structure includes a portion of a sense line.

4. The nonvolatile memory device of claim 2, wherein
    a word line connects to the first transistor structure, and
    a sense line connects to the second transistor structure.

5. The nonvolatile memory device of claim 1, further comprising:
    an n-well on the substrate, the pocket p-well being formed in the n-well.

6. The nonvolatile memory device of claim 5, wherein impurity regions of the first and second transistor structures are formed in the pocket p-well.

7. The nonvolatile memory device of claim 1, wherein the control gate includes a protruding portion aligned with a center of the device isolation layer.

8. The nonvolatile memory device of claim 7, wherein the second inter-gate dielectric is disposed between the protruding portion of the control gate and the device isolation layer.

9. The nonvolatile memory device of claim 1, wherein the second inter-gate dielectric directly contacts the device isolation layer, and the tunnel insulation layer directly contacts the device isolation layer and sidewalls of the second inter-gate dielectric.

* * * * *